United States Patent [19]

Lazzara

[11] 4,007,378
[45] Feb. 8, 1977

[54] SOLID STATE REPLACEMENT FOR A MECHANICAL RELAY

[75] Inventor: Anthony Ross Lazzara, Portola Valley, Calif.

[73] Assignee: Scientific Technology Incorporated, Mountain View, Calif.

[22] Filed: May 23, 1975

[21] Appl. No.: 580,417

[52] U.S. Cl. .............................. 307/112; 307/203; 307/252 J
[51] Int. Cl.² ....................................... H03K 19/12
[58] Field of Search ............ 307/252 B, 252 J, 203, 307/252 K, 112

[56] References Cited
UNITED STATES PATENTS

| | | | |
|---|---|---|---|
| 3,371,227 | 2/1968 | Sylvan | 307/252 J |
| 3,774,051 | 11/1973 | Chandler, Jr. | 307/203 |
| 3,890,512 | 6/1975 | Kumakawa et al. | 307/203 |

*Primary Examiner*—Herman J. Hohauser
*Attorney, Agent, or Firm*—Flehr, Hohbach, Test, Albritton, Herbert

[57] ABSTRACT

A direct replacement for mechanical relays without requirement for modification of associated circuitry and circuit connections. A standard relay base having a standard relay pin configuration is utilized for mating with a standard relay socket connected to the associated circuit. A control circuit is mounted on the base and connected to the relay pins and the base. A cover is provided which fits over the base and contains the control circuit. The cover has externally accessible cover terminals mounted therein connected to the control circuit. A remote heat sink is provided for mounting remotely from the relay base and socket for carrying a solid state triac device having a gate and first and second main terminals connected by electrical conductors to the cover terminals. The control circuit is configured to receive a command input signal and a power input signal. The command input signal enables the control circuit, so that the power input signal provides a trigger output coupled to the triac gate. In this fashion, the command input signal controls current between the first and second main terminals of the triac when a load voltage is impressed thereacross.

10 Claims, 4 Drawing Figures

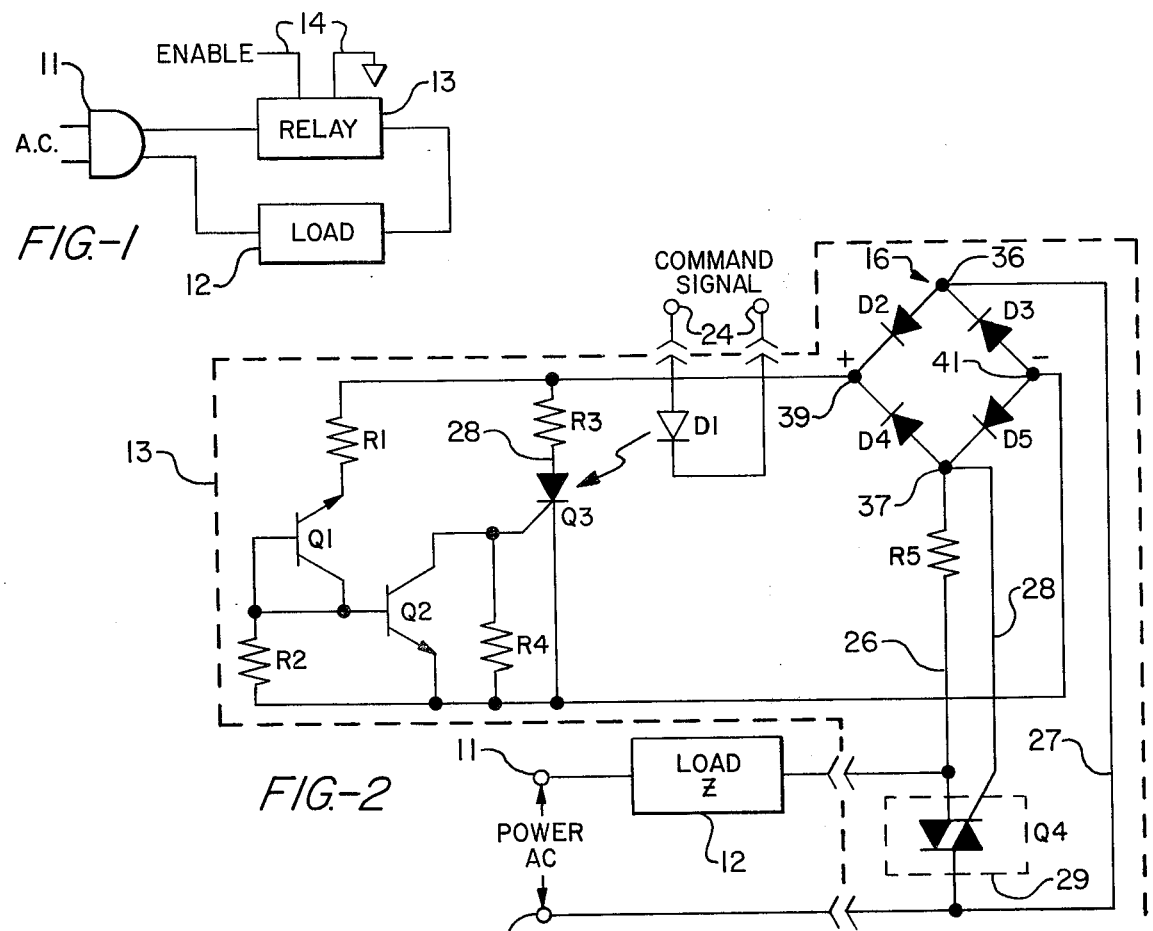
FIG.-1
FIG.-2
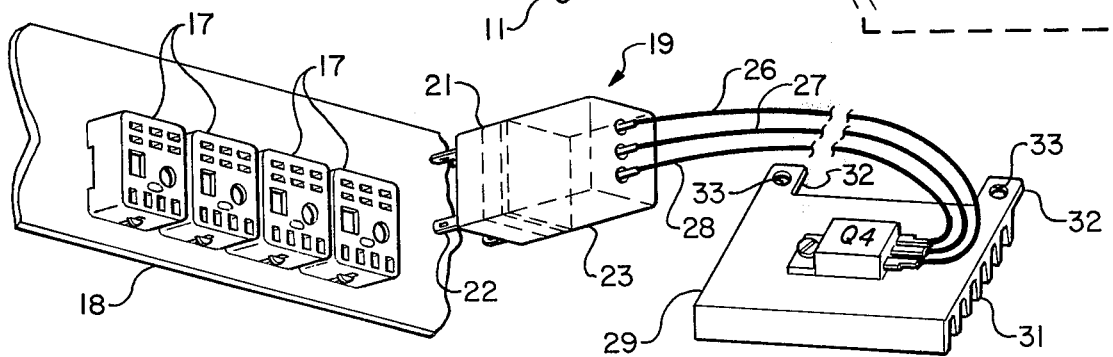
FIG.-3
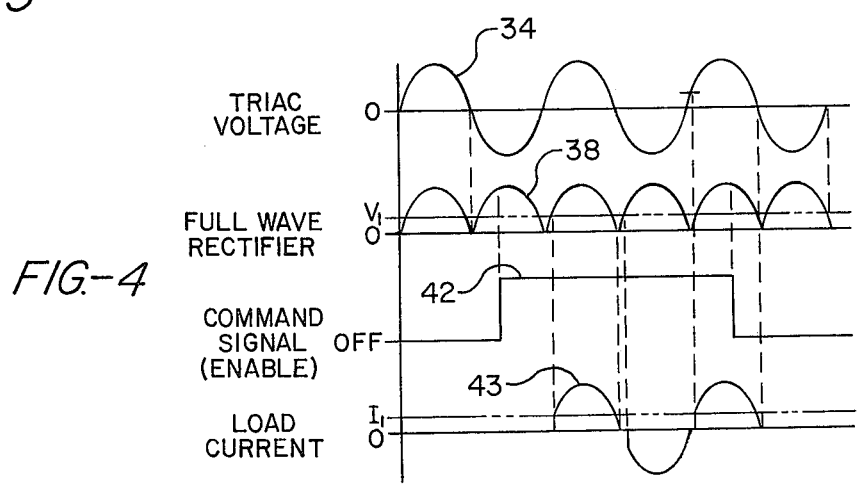
FIG.-4

SOLID STATE REPLACEMENT FOR A MECHANICAL RELAY

BACKGROUND OF THE INVENTION

This invention relates to a replacement for a mechanically switching relay and more particularly to such a replacement providing adequate heat dissipation for high load current switching.

Mechanical relays switching the high current levels produce high radio frequency noise levels due to arcing at the mechanical contacts during switch closure and opening. Solid state switches substituted for the mechanical switching contacts have high heat dissipation characteristics which require large volume mechanical relay substitutes for commensurate load current switching capabilities. There is therefore a need for a substitute for mechanical relays which eliminates radio frequency noise while at the same time providing substantially identical switch physical dimensions and acceptable switch heat dissipation.

SUMMARY AND OBJECTS OF THE INVENTION

The mechanical relay replacement disclosed herein utilizes a relay base having electrical pins mounted therein in a pattern and of a size to fit existing mechanical relay receptacles. The relay base has a control circuit mounted thereon on the side opposite the side from which the base pins extend. The control circuit is configured to receive a control input signal and is connected to the base pins. A heat sink is provided for remote mounting from the mechanical relay receptacle and a solid state switching means is mounted on the heat sink for switching high current levels. The solid state switching means has a control terminal and first and second current terminals. The control terminal is connected to the control circuit and a load voltage is impressed across the first and second current terminals. The control circuit operates to provide a trigger output in response to the control input signal which is connected to the control terminal output of the solid state switch. The replacement operates to provide a current between the first and second current terminals on the solid state switch, which is responsive to the control input signal and which assumes the level determined by the load voltage between the first and second current terminals while maintaining the mechanical relay volume and dissipating the power consumed by the solid state switch remotely from the mechanical relay receptacle.

It is an object of the present invention to provide a replacement for a mechanical relay which reduces radio frequency noise as compared to that generated by mechanical switch contacts.

It is another object of the present invention to provide a mechanical relay replacement utilizing a solid state switch within a mechanical relay volume while maintaining mechanical relay heat dissipation characteristics.

It is another object of the present invention to provide a mechanical relay replacement having a control input which is optically isolated from the power circuit.

It is another object of the present invention to provide a mechanical relay replacement which dissipates heat generated in load circuit switching remotely from the mechanical relay receptacle and base.

It is another object of the present invention to provide a mechanical relay replacement having infinitely long switching contact life.

It is another object of the present invention to provide a mechanical relay replacement which affords a relay size which is uniform for high and low load current switching.

Additional objects and features of the invention will appear from the following description in which the preferred embodiment has been set forth in detail in conjunction with the accompanying drawings.

BRIEF DESCRIPTION OF THE DRAWINGS

FIG. 1 is a block diagram showing the position of the mechanical relay replacement in a load circuit.

FIG. 2 is an electrical schematic of one embodiment of the disclosed invention.

FIG. 3 is an isometric view of the mechanical relay replacement configures in a standard mechanical relay outline for insertion in a standard mechanical relay receptacle.

FIG. 4 is a timing diagram of the circuit of FIG. 2.

DESCRIPTION OF THE PREFERRED EMBODIMENT

FIG. 1 shows the manner in which the invention disclosed herein is utilized in a load circuit. A load circuit power supply is connected through a load circuit connector 11 to a device 12 to be electrically energized through a relay 13 which is in series with the device 12. Relay 13 has enabling terminals 14 for controlling relay 13 in a conducting or nonconducting state.

Turning now to FIG. 2, a typical circuit for relay 13 is shown. The circuit 13 is known in the art and is but one element of the invention disclosed herein. Circuit 13 of FIG. 2 shows a gating transistor Q2 connected directly to a gate on a photo SCR Q3. When gating transistor Q2 is in conduction, it is in saturation for any amount of Q3 gate current generated by exposure to light energy emanating from light emitting diode D1. Therefore, for any amount of photo generated gate current from photo SCR Q3 the gate of Q3 is clamped to substantially the emitter voltage of gating transistor Q2. Consequently, the gate to cathode voltage in photo SCR Q3 cannot rise to a voltage to bring the photo SCR gate cathode junction to the trigger threshold. Therefore the photo SCR is prevented from being turned on when exposed to the light energy emitted from light emitting diode D1. Transistor Q1 is connected to function as a zener diode at the base emitter junction breakdown voltage. Therefore, if the light emitting diode D1 is energized by a command signal after the anode cathode voltage of photo SCR Q3 exceeds $V_1$, Q3 is inhibited from conduction until the anode cathode voltage is reduced below the base emitter breakdown voltage of Q1. Prior to reaching the base emitter breakdown of Q1 as anode cathode voltage of Q3 rises, Q3 will turn on in response to a command signal energizing light emitting diode D1 before the anode cathode voltage exceeds the base emitter breakdown voltage of Q1. As Q3 conducts, the base emitter breakdown voltage of Q1 is not reached. An AC power signal delivered through connector 11 to a full wave rectifier 16 is therefore produced through photo SCR Q3 at the gate of triac Q4. This signal delivered to the gate of Q4 is a trigger signal and is in the form of a full wave rectified signal in this embodiment.

Q4 may be seen to be in series with load 12 energized by AC power through load circuit connected terminals 11. When triac Q4 is gated to an "on" condition AC power is provided to load 12. In this fashion, it may be seen that load power is provided through a triac Q4 for switching high load current levels in response to a command signal connected to a relay or control circuit 13 which provides a trigger output signal for triac Q4 in response to the command signal input.

The circuit of FIG. 2 includes the embodiment wherein triac Q4 is required to pass a sufficiently small load current so that standard mechanical relay outline dimensions are not exceeded when control circuit 13 and triac Q4 are included therein.

FIG. 3 shows a standard mechanical relay receptacle 17 on a mounting framework 18 in typical spaced arrangement for receiving mechanical relays. A mechanical relay 19 is shown for mating with relay receptacles 17, having outline dimensions whereby relays 19 may be inserted in receptacles 17 in side by side arrangement. Mechanical relay configuration 19 includes a relay base 21 having a plurality of electrical base pins 22 arranged therein in a pattern matching the socket pattern in relay receptacle 17. A cover 23 is formed to fit relay base 21 on the side opposite the side from which base pins 22 extend. Control circuit 13 is mounted within relay cover 23 and is connected through base pins 22 to load circuit connector terminals 11 and a pair of command signal terminals 24. Leads 26, 27 and 28 extend from full wave rectifier 16 to first and second main terminals and the gate terminal of triac Q4 respectively. Q4 is shown mounted on a heat sink 29 having fins 31 and mounting tabs 32 with mounting holes 33 therein for convenient mounting remote from the mount 18 for mechanical relay receptacles 17. In this fashion a load current may be delivered between first and second main terminals 26 and 27 respectively on triac Q4 in response to a command signal at command signal terminals 24. Radio frequency noise is reduced by the absence of arcing between mechanical switching contacts and heat sinking is provided remotely from mounting 18 and relay receptacles 17 so that high load current levels may be switched between first and second main terminals on triac Q4 without changing the volume of mechanical relay configuration 19. Existing arrays of mechanical relay receptacles 17 may therefore be utilized by the disclosed mechanical relay replacement without repositioning of receptacles 17 or modification to the circuitry connected thereto.

A description of signals associated with control circuit 13 may be undertaken by reference to FIG. 4. An AC voltage wave form 34 is applied to load circuit connector 11 and therefore across the first and second main terminals of triac Q4. Voltage 34 is applied to input terminals 36 and 37 of full wave rectifier 16. A full wave rectifier output 38 is seen as obtained from terminals 39 and 41 of full wave rectifier 16. As explained above, photo SCR Q3 cannot conduct while the gate thereof is clamped to a voltage which is less than the gate cathode trigger threshold. Upon application of a command signal 42 at command signal terminals 24 diode D1 produces light energy sufficient to trigger photo SCR Q3 to a conducting condition provided the emitter base breakdown voltage level of transistor Q1 is not yet reached. As seen in FIG. 4, wave 38 is in excess of the emitter base breakdown voltage $V_1$ of transistor Q1 at the leading edge of command signal 42. Therefore, the full wave rectified signal 38 must decrease below the $V_1$ level toward zero level and begin rising thereafter before photo SCR Q3 will conduct. Presuming photo SCR Q3 conducts at approximately $V_1$, a trigger output is provided from full wave rectifier 16 through lead 28 to the gate of triac Q4, whereby load current 43 is obtained between the first and second main terminals of triac Q4.

It will be noted that load current 43 assumes an instantaneous level $I_1$ at the point where the fully rectified wave 38 reaches voltage level $V_1$. This presumes a resistive load for the purposes of this description. Load current 43 is thereafter in phase with AC voltage wave form 34 until the level of load current 43 reaches zero whereupon load current 43 ceases until photo SCR Q4 recommutates. Recommutation may be seen to occur by reference to load current 43 at the beginning of each half cycle of AC voltage wave form 34 as determined by full wave rectified wave form 38.

A replacement for a mechanical relay has been disclosed which provides for zero switching thereby reducing radio frequency noise generated by the means for switching the load current, and which further provides for standard mechanical relay outline dimensions for solid state switching of a wide range of load current levels. Heat sinking for high load current switching levels is provided remotely from the relay receptacles, receptacle mounts, associated circuitry and control circuitry. Mechanical relay replacements have been disclosed for solid state switching of low level load currents totally within existing mechanical relay outlines. Switching of high level load current switching is performed within current mechanical relay outlines together with remote solid state load current switching to provide for load current switching heat dissipation remote from associated relay receptacles and circuitry.

What is claimed is:

1. A mechanical relay replacement for insertion into a mechanical relay receptacle in which is provided a predetermined socket pattern comprising
    a relay base,
    a plurality of electrical base pins formed to fit the sockets and mounted on a first side of said relay base and having a pin pattern matching the socket pattern,
    a control circuit for receiving a control input signal, said control circuit being mounted on a second side of said relay base and connected to said base pins,
    an enclosure attached to said relay base enclosing said control circuit,
    a heat sink for remote mounting from said relay base and receptacle,
    means for switching a high current level mounted on said heat sink, said last named means having a control terminal and first and second current terminals,
    whereby standard size is maintained for said relay base and enclosure for high heat dissipation due to high current switching,
    said control circuit operating to provide a trigger output responsive to said control input signal,
    and means for coupling said trigger output to said control terminal,
    whereby a current between said first and second current terminals is commanded by said control input signal to assume a level determined by a load voltage therebetween and heat resulting from said current through said means for switching is dissipated remotely from said relay base.

2. A mechanical relay replacement as in claim 1 wherein said means for switching comprises a triac and wherein said control terminal comprises a gate terminal and said first and second current terminals comprise first and second terminals.

3. A mechanical relay replacement as in claim 2 wherein said control circuit includes a full wave rectifier for providing said trigger output and wherein said load voltage is AC.

4. A mechanical relay replacement as in claim 3 wherein said control circuit includes a light emitting diode for receiving said control input signal and a photo SCR exposed to said light emitting diode, said full wave rectifier being enabled by said photo SCR, whereby said control input signal is optically isolated from said load voltage.

5. A mechanical relay replacement for insertion into a standard mechanical relay receptacle in which is predetermined socket pattern is provided comprising
   a standard configuration relay base,
   a plurality of electrical base pins formed to fit the sockets and mounted in said relay base in a pin pattern matching the predetermined socket pattern,
   a standard relay cover attached to said relay base,
   a control circuit contained within said standard relay cover and connected to said base pins,
   a heat sink for mounting remotely from said standard relay base,
   a triac mounted on said heat sink and having a gate terminal and first and second main terminals, whereby remote heat sinking is provided for switched current through said first and second main terminals and said standard relay base and cover size is maintained independent of the magnitude of the switched current,
   means for enabling said control circuit responsive to an input command signal,
   said control circuit being configured to receive an input signal and to produce a trigger output related thereto when said control circuit is enabled by said input command signal,
   means for connecting said trigger output to said gate, whereby said input command signal commands said triac to pass current between said first and second main terminals when a load voltage is applied therebetween and said input signal is applied to said control circuit.

6. A mechanical relay replacement as in claim 5 wherein said control circuit includes a full wave rectifier for providing said trigger output and wherein said load voltage is AC.

7. A mechanical relay replacement as in claim 5 wherein said means for enabling comprises a light emitting diode and a photo SCR exposed to said light emitting diode, said photo SCR being connected to said control circuit.

8. A mechanical relay replacement for insertion in ones of a plurality of mechanical relay receptacles disposed on a mounting framework in spaced side by side arrangement, each relay receptacle containing a predetermined socket pattern, comprising
   a relay base,
   a plurality of electrical base pins mounted on one side of said relay base formed to fit into the sockets and arrayed in a pin pattern matching the socket pattern,
   a cover formed to fit on the side of said relay base opposed from said one side, said cover being configured to avoid interference with a cover on a relay replacement in an adjacent relay receptacle,
   a plurality of electrical cover terminals mounted in said relay cover, said cover terminals being externally accessible,
   a control circuit contained within said cover and electrically connected to said base pins and said cover terminals,
   said control circuit being configured to receive a command signal and an input signal and to provide a trigger output signal in response to said command signal,
   a heat sink for mounting remotely from the mechanical relay receptacle,
   a triac mounted on said heat sink, said triac having a gate and first and second main terminals,
   electrical conducting leads extending from ones of said plurality of cover terminals to each of said gate and first and second main terminals so that said gate is coupled to said trigger output and a load voltage is connected across said first and second main terminals,
   whereby said triac conducts a load current between said first and second main terminals in response to said command signal.

9. A mechanical relay replacement as in claim 8 wherein said control circuit includes a full wave rectifier for providing said trigger output and wherein said load voltage is AC.

10. A mechanical relay replacement as in claim 8 wherein said control circuit includes a light emitting diode for receiving said command signal and a photo sensitive circuit element exposed to said light emitting diode, said photo sensitive circuit element providing a light responsive output being connected to convert said input signal to said trigger output.

* * * * *